(12) United States Patent
Wang

(10) Patent No.: US 7,300,731 B2
(45) Date of Patent: Nov. 27, 2007

(54) SPATIALLY-DOPED CHARGE TRANSPORT LAYERS

(75) Inventor: Ying Wang, Wilmington, DE (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 261 days.

(21) Appl. No.: 10/914,873

(22) Filed: Aug. 10, 2004

(65) Prior Publication Data

US 2006/0032528 A1    Feb. 16, 2006

(51) Int. Cl.
*G03G 5/047*    (2006.01)
*H01L 31/00*    (2006.01)

(52) U.S. Cl. ............... 430/58.35; 430/58.4; 430/58.6; 430/58.65; 430/58.75; 430/58.8; 136/263

(58) Field of Classification Search ............... 136/263; 313/503, 505, 506; 430/56, 58.5, 79, 58.35, 430/58.4, 58.6, 58.65, 58.75, 58.8
See application file for complete search history.

(56) References Cited

U.S. PATENT DOCUMENTS

| | | | |
|---|---|---|---|
| 5,343,050 A * | 8/1994 | Egusa et al. ............... 257/40 |
| 6,097,147 A | 8/2000 | Baldo et al. | |
| 6,661,023 B2 | 12/2003 | Hoag et al. | |
| 6,670,053 B2 | 12/2003 | Conley | |
| 6,682,832 B2 | 1/2004 | Satou et al. | |
| 6,692,820 B2 | 2/2004 | Forrest et al. | |
| 6,867,538 B2 * | 3/2005 | Adachi et al. ............... 313/503 |
| 7,037,601 B2 * | 5/2006 | Hatwar ....................... 428/690 |
| 2003/0075720 A1 | 4/2003 | Liao et al. | |
| 2003/0189216 A1 | 10/2003 | Kamatani et al. | |
| 2003/0224202 A1 | 12/2003 | Brown et al. | |
| 2003/0230738 A1 | 12/2003 | Thoms et al. | |
| 2004/0007969 A1 | 1/2004 | Lu et al. | |
| 2004/0021136 A1 | 2/2004 | Matsuo et al. | |
| 2004/0043140 A1 | 3/2004 | Jagannathan et al. | |
| 2006/0228577 A1 * | 10/2006 | Nagara ....................... 428/690 |

OTHER PUBLICATIONS

Hoshino, Satoshi et al., Electroluminscence from triplet excited states of benzophenone, Appl. Phys. Lett., Jul. 8, 1996, 224-226, 69(2), American Institute of Physics.

* cited by examiner

*Primary Examiner*—Hoa Van Le
(74) *Attorney, Agent, or Firm*—John H. Lamming

(57) ABSTRACT

The present invention relates to new a charge transport layer that includes first charge transport material which is spatially doped with a second charge transport material. The charge transport layer may either be a hole or electron transport layer and is useful in organic electronic devices.

16 Claims, 6 Drawing Sheets

SPATIALLY-DOPED CHARGE TRANSPORT LAYERS

BACKGROUND OF THE INVENTION

1. Field of the Invention

The present invention relates to charge transport layers useful in organic electronic devices. The invention further relates to electronic devices in which there is at least one such charge transport layer.

2. Background

In organic electronic devices, such as organic light-emitting diodes ("OLEDs"), that make up displays, the organic active layer is sandwiched between two electrical contact layers. In an OLED the organic active layer is photoactive where upon application of a voltage across the electrical contact layers, the contact layers generate positively-charged holes and negatively charged electrons, which combine in the photoactive layer and cause photon generation. At least one of the electrical contact layers is transparent or translucent so that the generated photons can pass through the electrical contact layer and escape the device.

It is well known to use organic electroluminescent compounds as the photoactive component in OLEDs. Simple organic molecules, conjugated polymers, and organometallic complexes have been used.

These devices frequently include one or more charge transport layers, which are positioned between the photoactive (e.g., light-emitting) layer and one or both of the contact layers. A hole transport layer may be positioned between the photoactive layer and the hole-injecting contact layer, also called the anode. An electron transport layer may be positioned between the photoactive layer and the electron-injecting contact layer, also called the cathode.

There is a continuing need for charge transport layers.

SUMMARY OF THE INVENTION

A new charge transport layer is provided comprising a host charge transport material and a guest charge transport material, wherein said guest material is spatially doped within the host material.

The foregoing general description and the following detailed description are exemplary and explanatory only and are not restrictive of the invention, as defined in the appended claims.

BRIEF DESCRIPTION OF THE DRAWINGS

The invention is illustrated by way of example and not limitation in the accompanying figures.

DETAILED DESCRIPTION OF THE PREFERRED EMBODIMENTS

Figure 1:
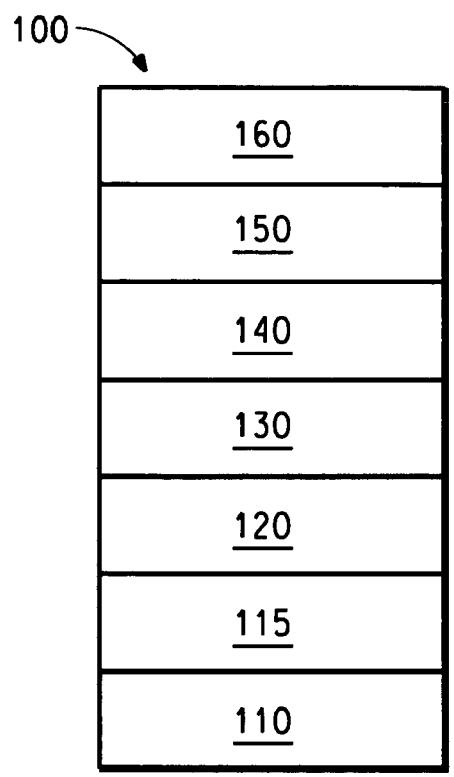
FIG. 1: A schematic diagram of a prior art OLED device.

A new charge transport layer comprises a host charge transport material and a guest charge transport material, wherein said guest material is spatially doped within the host material.

Another embodiment is a new organic electronic device having at least one charge transport layer comprising a host charge transport material and a guest charge transport material, wherein said guest material is spatially doped within the host material.

As used herein, the term "charge transport material" is intended to mean a compound or combination of compounds that can receive a charge from an electrode and facilitate its movement through the thickness of the material with relatively high efficiency and small loss of charge. Hole transport materials are capable of receiving a positive charge from an anode and transporting it. Electron transport materials are capable of receiving a negative charge from a cathode and transporting it.

As used herein, the term "host" is intended to mean a material which is present in an amount equal to or greater than 50% by weight of the charge transport layer. The term "guest" is intended to mean a material which is present in an amount equal to or less than 50% by weight of the charge transport layer. In one embodiment, the host is at least 60% of the charge transport layer. In one embodiment, the host is at least 75% of the charge transport layer. In one embodiment, the host is at least 85% by weight of the charge transport layer. In another embodiment, the host is at least 90% by weight of the charge transport layer. In another embodiment, the host is at least 95% by weight of the charge transport layer.

As used herein, the term "spatially doped" is intended to mean that a first material (guest) is located in a spatially discrete areas within a second material (host) such that together the two materials create a charge transport layer (e.g., the first material is neither distributed in the second material so as to create a substantially uniform or homogenous composition of the two materials nor are the two materials used to create separate layers of two of the materials in the device.) Rather the guest is located within the host in spatially discrete locations as shown, for example in FIGS. 3, 4, and 7-10.

Moreover, the first and second materials may be compositions comprising two or more charge transport components (such as two or more compounds and/or polymers), or may be compositions comprising one or more components that provide substantially all of the charge transport characteristics of the material and one or more component that provides little or no charge transport characteristics of the material.

In selecting guest and host materials for use in the new charge transport layer, the guest and host materials should be sufficiently compatible with one another so as to not significantly trap either holes or electrons (depending on whether such is a hole transport layer or an electron transport layer, respectively). Any number of techniques can be used to determine presence and degree of charge traps and such techniques include (1) impedance spectroscopy and (2) thermally stimulated currents.

Moreover, the new charge transport layer should be sufficiently compatible with the layers of the organic electronic device in which it is used so as to not significantly trap either holes or electrons (depending on whether such is a hole transport layer or an electron transport layer, respectively), which can also be determined as explained above. In one embodiment, both the host and guest materials are hole transport materials. Examples of hole transport materials have been summarized in, for example, Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules include, but are not limited to: N,N'-diphenyl-N,N'-bis(3-methylphenyl)-[1,1'-biphenyl]-4,4'-diamine (TPD), 1,1-bis[(di4-tolylamino) phenyl]cyclohexane (TAPC), N,N'-bis(4-methylphenyl)-N,N'-bis(4-ethylphenyl)-[1,1'-(3,3'-dimethyl)biphenyl]-4,4'-diamine (ETPD), tetrakis-(3-methylphenyl)-N,N,N', N'-2,5-phenylenediamine (PDA), a-phenyl-4-N,N-diphenylaminostyrene (TPS), p-(diethylamino)benzaldehyde diphenylhydrazone (DEH), triphenylamine (TPA), bis[4-(N,N-diethylamino)-2-methylphenyl](4-methylphenyl)methane (MPMP), 1-phenyl-3-[p-(diethylamino)styryl]-5-[p-(diethylamino)phenyl] pyrazoline (PPR or DEASP), 1,2-trans-bis(9H-carbazol-9-yl)cyclobutane (DCZB), N,N,N', N'-tetrakis(4-methylphenyl)-(1,1'-biphenyl)4,4'-diamine (TTB), 4,4'-bis[N-(1-naphthyl)-N-phenylamino]biphenyl (NPB or NPD), carbazole biphenyl (CBP), and porphyrinic compounds, such as copper phthalocyanine. Commonly used hole transporting polymers include, but are not limited to polyvinylcarbazole, (phenylmethyl)polysilane, polythiophenes, such as poly(3,4-ethylenedioxythiophene), polypyrroles, and polyanilines. It is also possible to obtain hole transporting materials by doping hole transporting molecules such as those mentioned above into polymers, including those that are not typically charge transporting such as polystyrene and polycarbonate. In such a doped polymer, the hole transporting molecules are distributed throughout the polymer in a fashion to achieve a substantially homogenous composition (to the extent possible in view of the specific polymer(s) and hole transport molecule(s) selected). In one embodiment of the new charge transport layer, a polymer substantially-homogenously doped with hole transporting molecules is used as one of the charge transport materials (either in the host or guest material).

In one embodiment, the host hole transport material used in new charge transport layer is selected from any of the hole transport materials given above or mixtures thereof. In one embodiment, the host has a high mobility for holes (positive charges), >10$^{-6}$ cm$^2$N/sec at the operating voltage. Its highest occupied molecular orbital ("HOMO") levels should be selected to allow low barrier hole injection from the anode. In one embodiment, the host is also capable of transporting electrons, with a mobility >10$^{-7}$ cm$^2$N/sec at the operating voltage. The thickness of the host hole transport layer can range between 1 nm to 1000 nm. In one embodiment, the host thickness is from 10 nm to 500 nm.

In one embodiment, the guest hole transport material is selected from any of the above hole transport materials or mixtures thereof, but is different from the host material. In one embodiment, the guest material has a high mobility for holes (positive charges), >10$^{-6}$ cm$^2$N/sec at the operating voltage. In one embodiment, the lowest unoccupied molecular orbital ("LUMO") level of the guest hole transport material is higher than the LUMO level of the host hole transport material. "Higher" is defined as closer to the vacuum level which is energy zero, so "higher energy" means the absolute value of the energy is smaller.

In one embodiment, the new charge transport layer comprises a host hole transport material that comprises a compound having at least two carbazole groups and the guest hole transport material comprises a triarylmethane compound.

In one embodiment, the new charge transport layer comprises host hole transport material that comprises a compound of Formula I below:

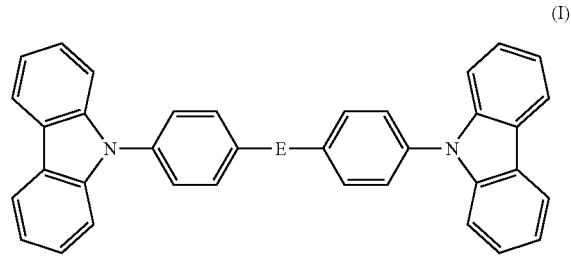

(I)

wherein E is selected from a single bond, $(CR^1R^2)_m$, O, S, $(SiR^1R^2)_m$ wherein m is an integer of 1 to 20, wherein $R^1$ and $R^2$ are each independently selected from H, F, alkyl, aryl, alkoxy, aryloxy, fluoroalkyl, fluoroaryl, fluoroalkoxy, and fluoroaryloxy, and wherein $R^1$ and $R^2$ can, when taken together, can form 5- or 6-membered rings.

In one embodiment, the new charge transport comprises a guest hole transport material that comprises a compound of Formula II below:

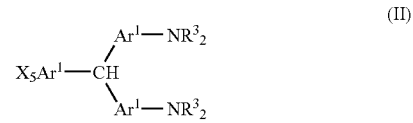

(II)

wherein:

$Ar^1$ can be the same or different at each occurrence and is selected from aryl and heteroaryl;

$R^3$ can be the same or different at each occurrence and is selected from H, alkyl, heteroalkyl, aryl, heteroaryl, arylalkylene, heteroarylalkylene, $C_nH_aF_b$, and $C_6H_cF_d$; or adjacent $R^3$ groups can be joined to form 5- or 6-membered rings;

X can be the same or different at each occurrence and is selected from $R^3$, alkenyl, alkynyl, $N(R^1)_2$, $OR^1$, $OC_nH_aF_b$, $OC_6H_cF_d$, halide, $NO_2$, OH, CN, and $COOR^1$;

n is an integer, and a, b, c, and d are 0 or an integer such that a+b =2n+1, and c+d =5.

In one embodiment, the host is CBP and the guest is MPMP.

In one embodiment, both the host and guest charge transport materials are electron transport materials. Examples of electron transport materials include, but are not limited to, metal chelated oxinoid compounds, such as bis(2-methyl-8-quinolinolato)(para-phenyl-phenolato)aluminum(III) (BAlQ) and tris(8-hydroxyquinolato)aluminum (Alq$_3$); azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5- tri(phenyl-2-benzimidazole)benzene (TPBI); quinoxaline derivatives such as 2,3-bis(4-fluorophenyl)quinoxaline; phenanthroline derivatives such as 9,10-diphenylphenanthroline (DPA) and 2,9-dimethyl-4,7-diphenyl-1,10-phenanthroline (DDPA); and mixtures thereof.

In one embodiment, the host electron transport material used in the new charge transport layer is selected from any of the electron transport materials given above or mixtures thereof. In one embodiment, the host has a high mobility for electrons, $>10^{-8}$ cm$^2$N/sec at the operating voltage. Its lowest un-occupied molecular orbital ("LUMO") levels should be selected to allow low barrier electron injection from the cathode. The thickness of the host electron transport layer can range between 1 nm to 1000 nm. In one embodiment, the host thickness is from 10 nm to 500 nm.

In one embodiment, the guest electron transport material is selected from any of the above electron transport materials, but is different from the host material. In one embodiment, the guest material has a high mobility for electrons, $>10^{-8}$ cm$^2$N/sec at the operating voltage. In one embodiment, the highest occupied molecular orbital ("HOMO") level of the guest electron transport material is lower than the HOMO level of the host electron transport material. "Lower" is defined as further away from the vacuum level which is energy zero, so "lower energy" means the absolute value of the energy is larger.

Spatial doping of the guest charge transport material in the host material can combine the positive attributes of different charge transport materials.

Embodiments of the new charge transport layer include the discrete layers of the guest materials at any desired location within the host material. For example, in one embodiment, the new charge transport layer comprises the guest charge transport material spatially doped as a thin sublayer within the host material.

In another embodiment, the guest material is discretely deposited and located at the approximate center of the host material in the new charge transport layer, or it can be discretely positioned toward the top or bottom of the host material. In one embodiment, the guest material creates a sublayer having a thickness within the host material that is less than 50% of the thickness of the host material used in the new charge transport layer. In one embodiment, the thickness of the guest sublayer is from 1% to 20% of the thickness of the host material as deposited. In one embodiment, it is from 2% to 10% of the thickness of the host material as deposited. In one embodiment, the guest sublayer is less than 5 nm in thickness. In one embodiment, the guest sublayer is less than 2 nm.

In other embodiments, the guest charge transport material can be deposited so as to have different configurations within the host charge transport material. In one embodiment, the guest material is present as more than one sub layer within the host material in the new charge transport layer. In one embodiment, the guest material is present as a layer having discontinuities. In one embodiment, the guest material is present as multiple discrete islands within the host material. The islands may be the same size or different sizes. In one embodiment, the guest material is present at differing amounts or gradations, the guest concentration varying across the thickness of the host material. That is the multiple discrete islands may have differing thicknesses and/or be located at differing discrete locations so that some are closer to the electrode side of the charge transport layer, while other discrete islands are in the approximate center of the charge transport layer, while still others are nearer to the other active layers in the organic electronic device.

Electronic Device

Another embodiment is a new organic electronic device having at least one charge transport layer comprising a host charge transport material and a guest charge transport material, wherein said guest material is spatially doped within the host material.

Organic electronic devices that may benefit from having one or more the new charge transport layer include, but are not limited to, (1) devices that convert electrical energy into radiation (e.g., a light-emitting diode, light emitting diode display, or diode laser), (2) devices that detect signals through electronics processes (e.g., photodetectors., photoconductive cells, photoresistors, photoswitches, phototransistors, phototubes, IR detectors), (3) devices that convert radiation into electrical energy, (e.g., a photovoltaic device or solar cell), and (4) devices that include one or more electronic components that include one or more organic semi-conductor layers (e.g., a transistor or diode). Other uses for the new charge transport layers include photoconductors and electrophotographic devices.

In one embodiment, the new organic electronic device is an OLED. In general, this device comprises a photoactive layer positioned between two electrical contact layers. Specific embodiments of the new charge transport layer of the present invention may be used between the photoactive layer and the first contact layer (anode) as a hole transport layer and/or between the photoactive layer and the second contact layer (cathode) as an electron transport layer The device may include a support or substrate, onto which the active materials are deposited, that can be adjacent to the anode layer or the cathode layer.

The anode is an electrode that is particularly efficient for injecting positive charge carriers. It can be made of, for example materials containing a metal, mixed metal, alloy, metal oxide or mixed-metal oxide, or it can be a conducting polymer, and mixtures thereof. Suitable metals include the Group 11 metals, the metals in Groups 4, 5, and 6, and the Group 8-10 transition metals. If the anode is to be light-transmitting, mixed-metal oxides of Groups 12, 13 and 14 metals, such as indium-tin-oxide ("ITO"), are generally used. The anode may also comprise an organic material such as polyaniline as described in "Flexible light-emitting diodes made from soluble conducting polymer," *Nature* vol. 357, pp 477-479 (11 Jun. 1992). The cathode is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides and mixtures thereof. Materials such as aluminum, indium, calcium, barium, samarium and magnesium, as well as combinations, can be used. Li-containing organometallic compounds, LiF, and Li$_2$O can also be deposited between the organic layer and the cathode layer to lower the operating voltage. Examples include LiF/Al and Mg/Ag.

With respect to OLED devices, at least one of the anode and cathode should be at least partially transparent to allow the generated light to be observed.

In an OLED device, the photoactive layer may typically comprise any organic electroluminescent ("EL") material, including, but not limited to, fluorescent dyes, fluorescent and phosphorescent metal complexes, conjugated polymers, and mixtures thereof. Examples of fluorescent dyes include, but are not limited to, pyrene, perylene, rubrene, derivatives thereof, and mixtures thereof. Examples of metal complexes include, but are not limited to, metal chelated oxinoid compounds, such as tris(8-hydroxyquinolato)aluminum (Alq3); and cyclometalated iridium and platinum electroluminescent compounds. Examples of conjugated polymers include, but are not limited to poly(phenylenevinylenes), polyfluorenes, poly(spirobifluorenes), polythiophenes, poly (p-phenylenes), copolymers thereof, and mixtures thereof.

In one embodiment, the photoactive material is an organometallic electroluminescent compound. In one embodiment, the photoactive material is selected from cyclometalated iridium and platinum electroluminescent compounds and mixtures thereof. Complexes of Iridium with phenylpyridine, phenylquinoline, or phenylpyrimidine ligands have been disclosed as electroluminescent compounds in Petrov et al., Published PCT Application WO 02/02714. Other organometallic complexes have been described in, for example, published applications US 2001/0019782, EP 1191612, WO 02/15645, and EP 1191614. Electroluminescent devices with an active layer of polyvinyl carbazole (PVK) doped with metallic complexes of iridium have been described by Burrows and Thompson in published PCT applications WO 00/70655 and WO 01/41512. Electroluminescent emissive layers comprising a charge carrying host material and a phosphorescent platinum complex have been described by Thompson et al., in U.S. Pat. No. 6,303,238, Bradley et al., in Synth. Met. (2001), 116 (1-3), 379-383, and Campbell et al., in Phys. Rev. B, Vol. 65 085210. Analogous tetradentate platinum complexes can also be used. These electroluminescent complexes can be used alone, or doped into charge-carrying hosts, as noted above.

Figure 3:
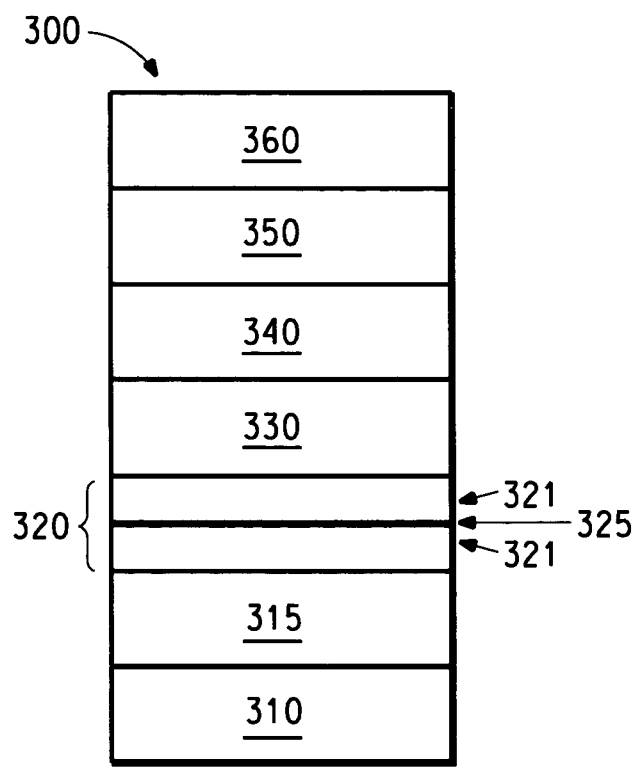
FIG. 3: A schematic diagram of an OLED device having one embodiment of the new charge transport layer.

In one embodiment, the new charge transport layer is a spatially-doped hole transport layer and the electron transport layer comprises any conventional electron transport material, as described above. This is illustrated in FIG. 3. Layer 310 is a substantially transparent anode, typically ITO. Optional layer 315 is a hole injection layer. A spatially-doped hole transport layer 320 is on top of the hole injection layer, when present, or the cathode. The spatially-doped hole transport layer comprises a host hole transport Imaterial 321, spatially doped with an ultra thin guest hole transport sub layer 325.

FIGS. 7-10 illustrate other exemplary embodiments of discretely located guest hole transport materials within the host hole transport material. In the illustrated example of FIGS. 3, and 7-10, a photoactive layer 330 is on top of the spatially doped hole transport layer, 320. In this illustration, the photoactive layer is luminescent. An electron transport layer 340 is on top of the photoactive layer. Optionally, an electron injection layer 350 is on top of the electron transport layer. An electron injection layer, as used herein, is a layer that receives electrons from the cathode and transports them to the electron transport layer and/or another active layer, such as light emitting layer in an OLED. A cathode 360 is on top of the electron injection layer, when present, or the photoactive layer.

Figure 4:
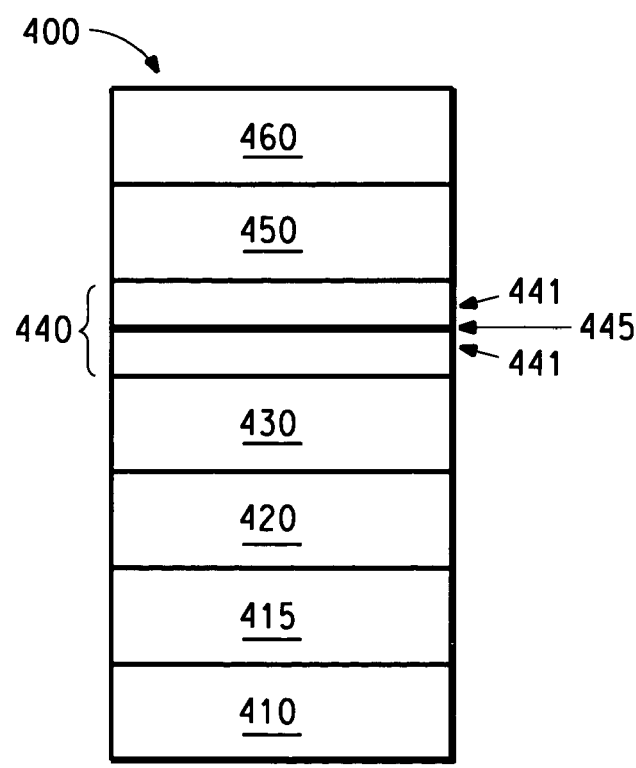
FIG. 4: A schematic diagram of an OLED device having another embodiment of the new charge transport layer

In one embodiment, the new charge transport layer is an electron transport layer is a spatially-doped electron transport layer and the hole transport layer comprises any conventional hole transport material, as described above. This is illustrated in FIG. 4, which is a example of one OLED device. Layer 410 is a substantially transparent anode, typically ITO. Optional layer 415 is a hole injection layer. A hole transport layer 420 is on top of the hole injection layer, when present, or the anode. A photoactive layer 430 is on top of the hole transport layer. In this illustration, the photoactive layer is luminescent. A spatially-doped electron transport layer 440 is on top of the photoactive layer. The spatially-doped layer comprises a host electron transport material 441, spatially doped with an ultra thin guest electron transport material as sublayer 445. It should be appreciated that the illustrations of the discrete locations of the guest material in the host material illustrated in FIGS. 7 through 10 are equally applicable for an electron transport layer, but specific figures are not shown. Optionally, an electron injection layer 450 is on top of the electron transport layer. An electron injection layer, as used herein, is a layer that receives electrons from the cathode and transports them to the electron transport layer and/or light emitting layer. A cathode 460 is on top of the electron injection layer, when present, or the photoactive layer. Typically, the cathode is LiF/Al or Mg/Ag.

In one embodiment, an organic device comprises at least one hole transport layer that is one embodiment of the new charge transport layer of the present invention and at least one electron transport layer that is another embodiment of the new charge transport layer of the present invention.

It is known to have other layers in organic electronic devices. For example, there can be a layer between the anode and the hole transport layer to facilitate positive charge transport and/or band-gap matching of the layers, or to function as a protective layer. Layers that are known in the art can be used. In addition, any of the above-described layers can be made of two or more layers. Alternatively, some or all of the anode layer, the hole transport layer, the electron transport layers, and the cathode layer, may be surface treated to increase charge carrier transport efficiency. The choice of materials for each of the component layers is preferably determined by balancing the goals of providing a device with high device efficiency with device operational lifetime.

It is understood that each functional layer may be made up of more than one layer.

The device can be prepared by depositing the various materials using any known technique, including, but not limited to vapor deposition techniques, liquid deposition techniques, thermal transfer techniques, and combinations thereof. The individual layers are sequentially deposited on a suitable substrate. Substrates such as glass, ceramic, metals, and polymeric films can be used. Conventional vapor deposition techniques can be used, such as thermal evaporation, chemical vapor deposition, and the like. Alternatively, the organic layers can be applied using liquid deposition techniques. The liquid can be in the form of a solution, dispersion, suspension, emulsion, or the like. Typical liquid deposition techniques include, but are not limited to, continuous deposition techniques such as spin coating, gravure coating, curtain coating, dip coating, slot-die coating, spray coating, and continuous nozzle coating; and discontinuous deposition techniques such as ink jet printing, gravure printing, and screen printing. To achieve the new charge transport layer of the present invention, the guest material and host material are deposited discretely and may be deposited using the same or different techniques, depending on the actual materials and other fabrication considerations for a particular device.

In general, the different layers will have the following range of thicknesses: anode 110, 500-5000 Å, in one embodiment 1000-2000 Å; hole transport layer 120, 50-2000 Å, in one embodiment 200-1000 Å; photoactive layer 130, 10-2000 Å, in one embodiment 100-1000 Å; electron transport layer 140 and 150, 50-2000 Å, in one embodiment 100-1000 Å; cathode 160, 200-10000 Å, in one embodiment 300-5000 Å. The location of the electron-hole recombination zone in the device, and thus the emission spectrum of the device, can be affected by the relative thickness of each layer. For example, with respect to an OLED, the thickness of the electron-transport layer should be chosen so that the electron-hole recombination zone is in the light-emitting layer. The desired ratio of layer thicknesses will depend on the exact nature of the materials used.

As used herein, the term "alkyl" is intended to mean a group derived from an aliphatic hydrocarbon having one point of attachment. The term "alkenyl" is intended to mean a group derived from a hydrocarbon having one or more carbon-carbon double bonds and having one point of attachment. The term "alkynyl" is intended to mean a group derived from a hydrocarbon having one or more carbon-carbon triple bonds and having one point of attachment. The term "aryl" is intended to mean a group derived from an aromatic hydrocarbon having one point of attachment. The term "arylalkylene" is intended to mean a group derived from an alkyl group having an aryl substituent. The term "alkoxy" refers to an alkyl group attached to an oxygen atom, and further attached to another molecule by the oxygen. The term "aryloxy" refers to an aryl group attached to an oxygen atom, and further attached to another molecule by the oxygen.

The term "group" is intended to mean a part of a compound, such as a substituent in an organic compound.

The term "compound" is intended to mean an electrically uncharged substance made up of molecules that further consist of atoms, wherein the atoms cannot be separated by physical means.

The term "layer" is used interchangeably with the term "film" and refers to a coating covering a desired area. The area can be as large as an entire device or a specific functional area such as the actual visual display, or as small as a single sub-pixel. Films can be formed by any conventional deposition technique, including vapor deposition and liquid deposition.

As used herein, the terms "emitter", "luminescent material", or "photoactive" refer to a material that emits light when activated by an applied voltage (such as in a light-emitting diode or light-emitting electrochemical cell), or responds to radiant energy and generates a signal with or without an applied bias voltage (such as in a photodetector or photoconductor), as the case may be in the specific device, as will be understood from the context.

As used herein, an "organometallic compound" is a compound having a metal-carbon bond. The organometallic compound may include metal atoms from Groups 3 through 15 of the Periodic Table and mixtures thereof.

The prefix "hetero" indicates that one or more carbon atoms has been replaced with a different atom.

The prefix "fluoro" indicates that one or more hydrogens bonded to a carbon has been replaced with fluorine.

Unless otherwise indicated, all groups can be unsubstituted or substituted. Unless otherwise indicated, all groups can be linear, branched or cyclic, where possible. Unless otherwise indicated, all groups can have from 1-30 carbon atoms.

The phrase "adjacent to," when used to refer to layers in a device, does not necessarily mean that one layer is immediately next to another layer. On the other hand, the phrase "adjacent R groups" is used to refer to R groups that are next to each other in a chemical formula (i.e., R groups that are on atoms joined by a bond).

The IUPAC number system is used throughout, where the groups from the Periodic Table are numbered from left to right as 1-18 (CRC Handbook of Chemistry and Physics, 81$^{st}$ Edition, 2000).

As used herein, the phrase "X is selected from A, B, and C" is equivalent to the phrase "X is selected from the group consisting of A, B, and C", and is intended to mean that X is A, or X is B, or X is C. The phrase "X is selected from 1 through n" is intended to mean that X is 1, or X is 2, . . . or X is n.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Unless otherwise defined, all letter symbols in the figures represent atoms with that atomic abbreviation. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

The new charge transport layer and its uses will now be described by reference to the following non-limiting examples.

EXAMPLES

The following examples illustrate certain features and advantages of the present invention. They are intended to be illustrative of the invention, but not limiting. All percentages are by weight, unless otherwise indicated.

General Procedure

OLED devices were fabricated by the thermal evaporation technique. The base vacuum for all of the thin film deposition was in the range of $10^{-6}$ torr. The deposition chamber was capable of depositing eight different films without the need to break the vacuum. Patterned indium tin oxide coated glass substrates from Thin Film Devices, Inc were used. These ITO's are based on Corning 1737 glass coated with 1400 Å ITO coating, with sheet resistance of 30 ohms/square and 80% light transmission. The patterned ITO substrates were then cleaned ultrasonically in aqueous detergent solution. The substrates were then rinsed with distilled water, followed by isopropanol, and then degreased in toluene vapor.

The cleaned, patterned ITO substrate was then loaded into the vacuum chamber and the chamber was pumped down to $10^{-6}$ torr. The substrate was then further cleaned using an oxygen plasma for about 5 minutes. After cleaning, multiple layers of thin films were then deposited sequentially onto the substrate by thermal evaporation. Patterned metal electrodes (Al or LiF/Al) were deposited through a mask. The thickness of the film was measured during deposition using a quartz crystal monitor. The completed OLED device was then taken out of the vacuum chamber and characterized immediately without encapsulation.

The OLED samples were characterized by measuring their (1) current-voltage (I-V) curves, (2) electroluminescence radiance versus voltage, and (3) electroluminescence spectra versus voltage. The I-V curves were measured with a Keithley Source-Measurement Unit Model 237. The electroluminescence radiance (in the unit of $cd/m^2$) vs. voltage was measured with a Minolta LS-110 luminescence meter, while the voltage was scanned using the Keithley SMU. The electroluminescence spectrum was obtained by collecting light using an optical fiber, through an electronic shutter, dispersed through a spectrograph, and then measured with a diode array detector. All three measurements were performed at the same time and controlled by a computer. The efficiency of the device at a certain voltage is determined by dividing the electroluminescence radiance of the LED by the current density needed to run the device. The unit is in cd/A.

Materials used in the examples are listed below. MPMP is the guest hole transport material, CBP is the host hole transport material, DPA is the electron transport material, AlQ is the electron injection material, and G1 is a green emitter. Their molecular structures are shown in the following:

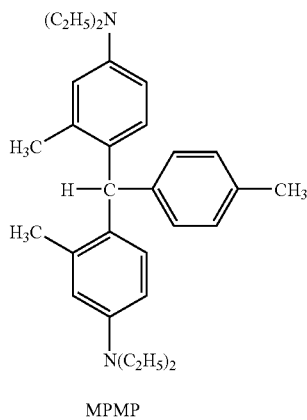

MPMP

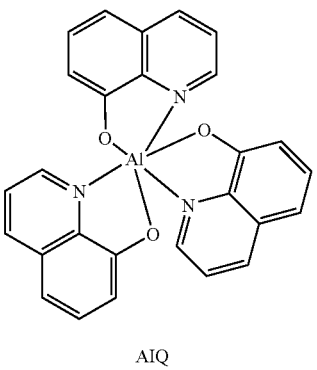

AlQ

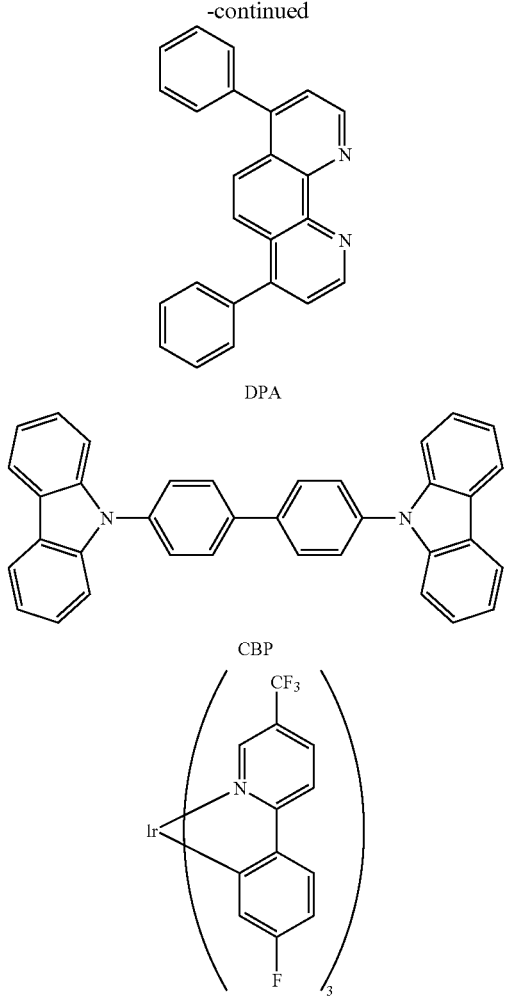

DPA

CBP

G1

Comparative Example 1

In this comparative example a device was made having a prior art structure, as shown in FIG. 1. The device 100 has an anode layer 110 and a cathode layer 160. Adjacent to the anode is a layer 120 comprising hole transport material. Adjacent to the cathode is a layer 140 comprising two electron transport material Between the hole transport layer and the electron transport layer is the photoactive layer 130. As an option, devices frequently use another electron injection layer 150, next to the cathode, and/or another hole injection layer 115, next to the anode. In this example, optional layer 115 is not present.

The device was made according to the General Procedure with the following configuration, with layer thicknesses given in parenthesis:
Substrate: glass
Anode: ITO
Hole transport layer: MPMP (304 Å)
Emitter: G1 (401 Å)
Electron transport layer: DPA (102 Å)
Electron transport layer: AlQ(303 Å)
Cathode: LiF(10 Å)/Al(505 Å)

Figure 5:
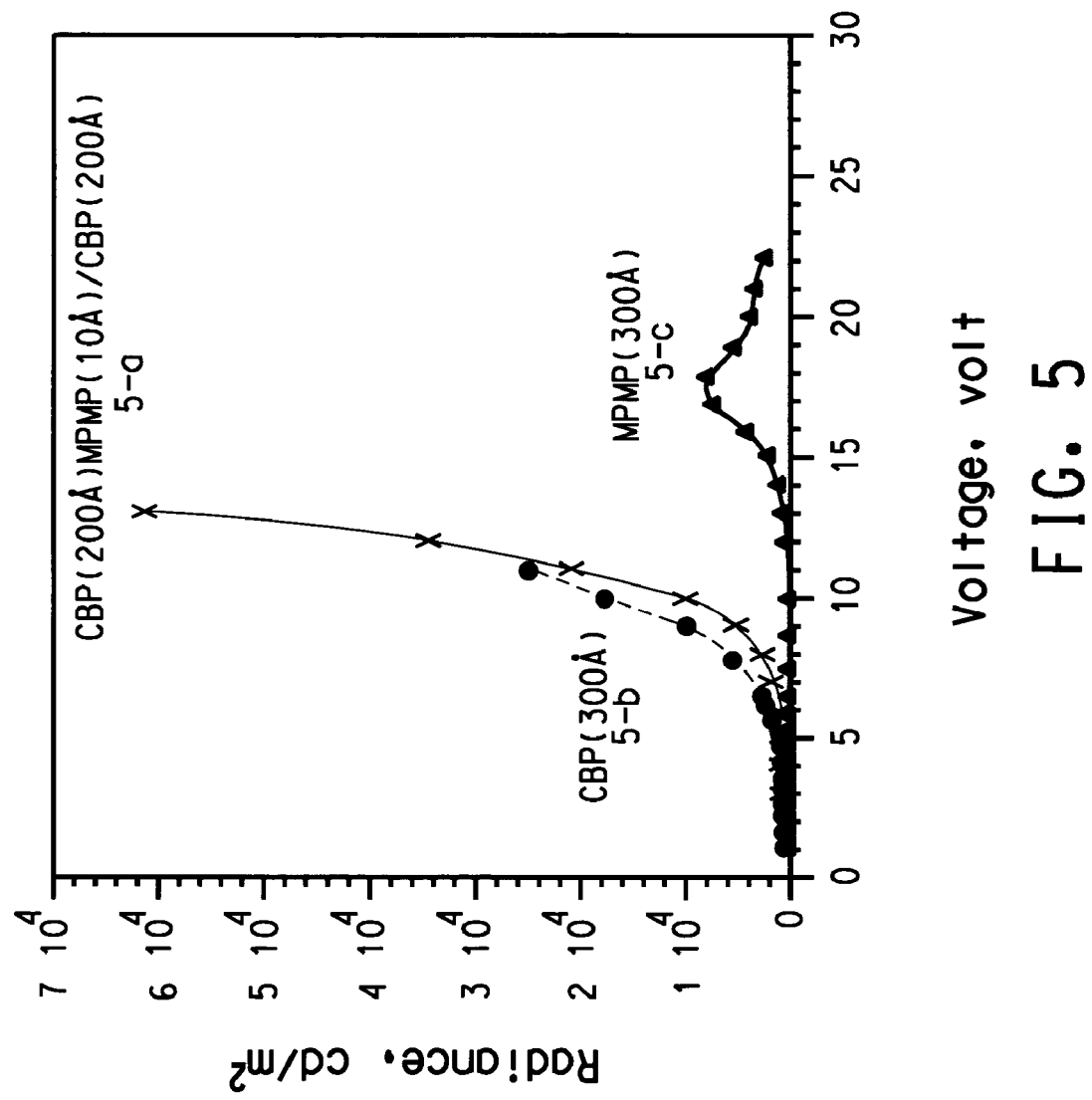
FIG. 5: A comparison of radiance vs voltage curves for OLED devices made with one embodiment of the new charge transport layer (a hole transport layer) (curve 5-*a*) and with conventional hole transport layers (curves 5-*b* and 5-*c*).
Figure 6:
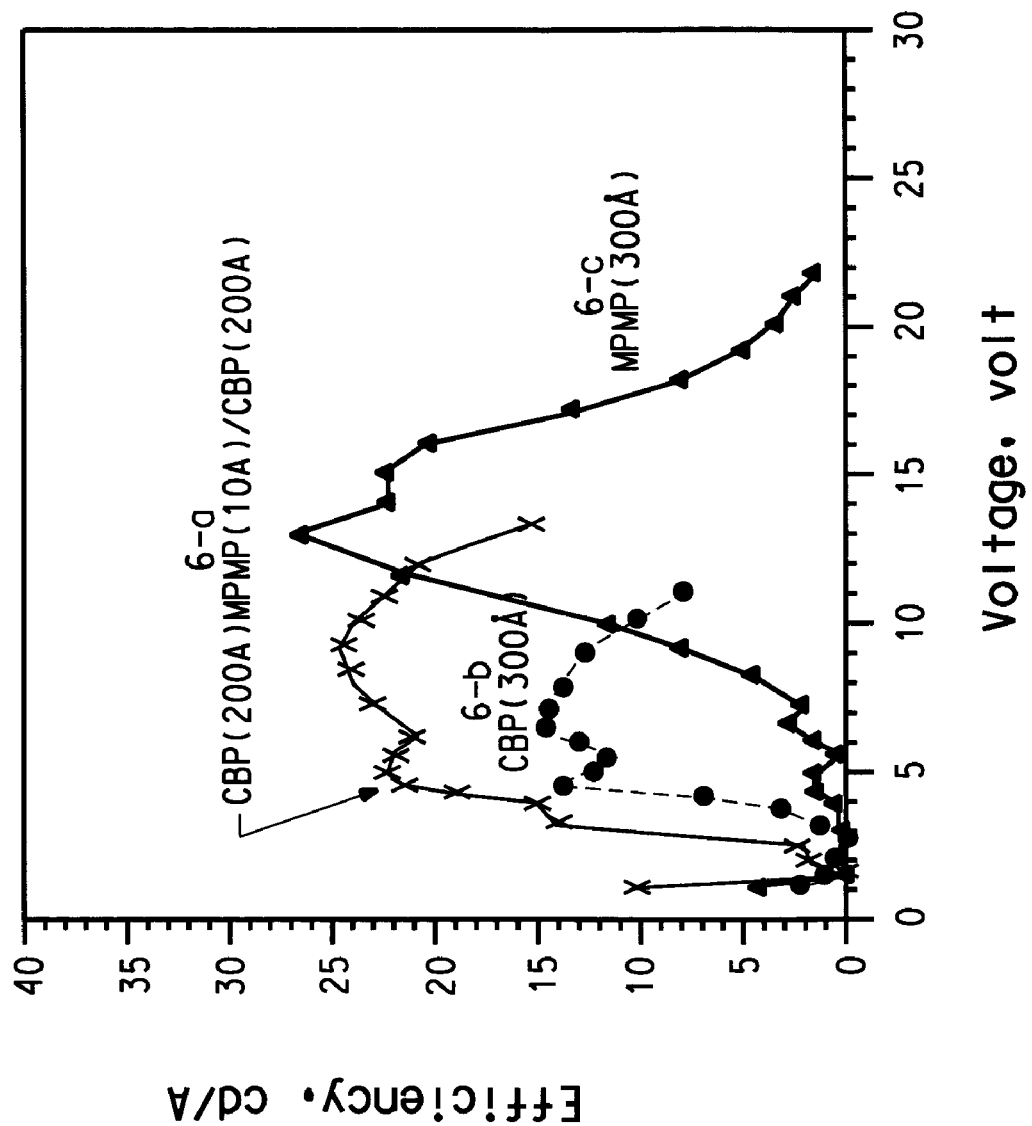
FIG. 6: A comparison of efficiency vs voltage curves for OLED devices made with one embodiment of the new charge transport layer (a hole transport layer) (curve 6-*a*) and with conventional hole transport layers (curves 6-*b* and 6-*c*).
Figure 7:
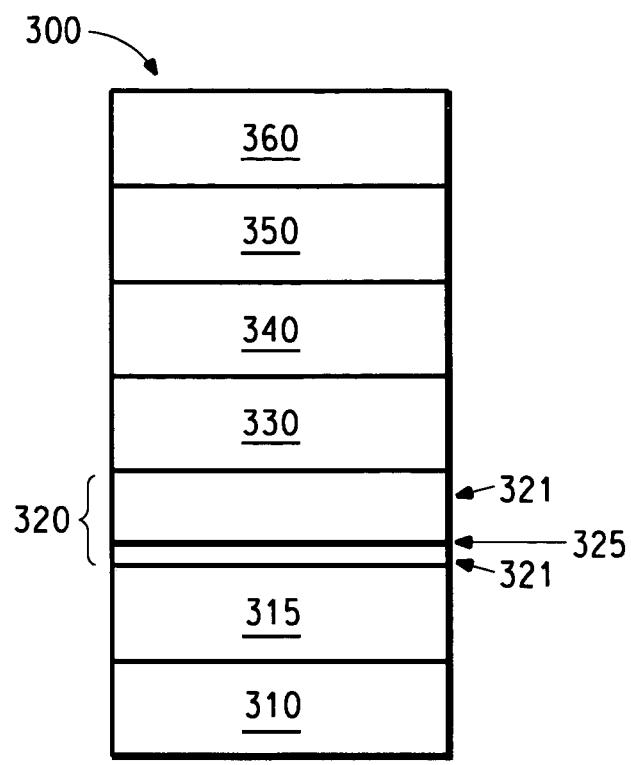
FIGS. 7-10: Are schematic diagrams of an OLED device having other embodiments of a new charge transport layer.
Figure 8:
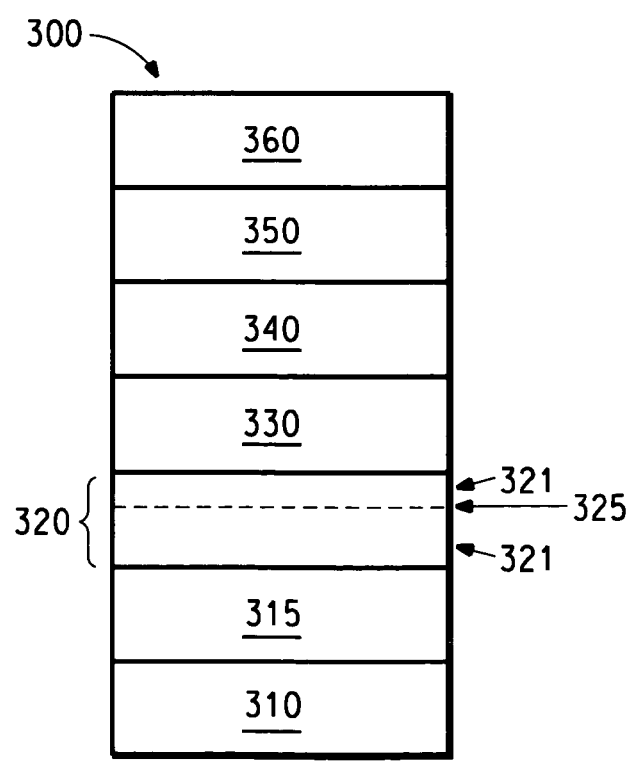
Figure 9:
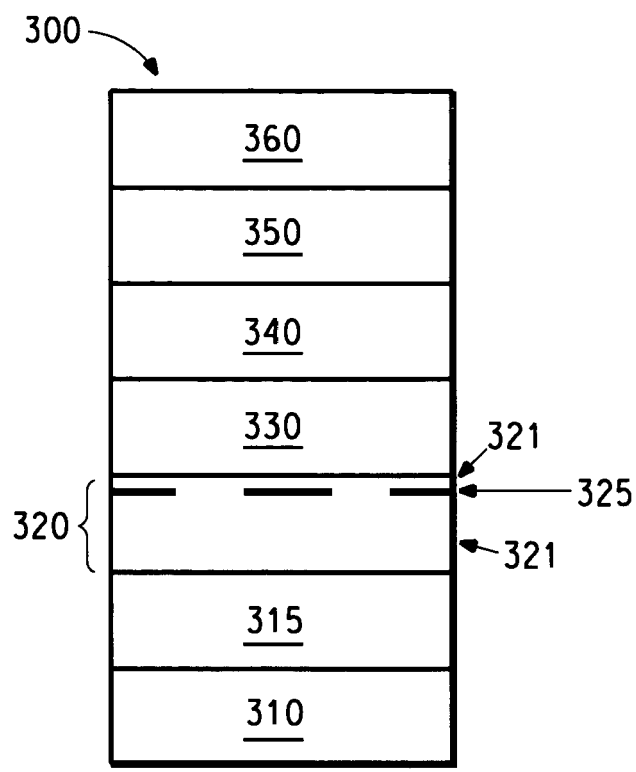
Figure 10:
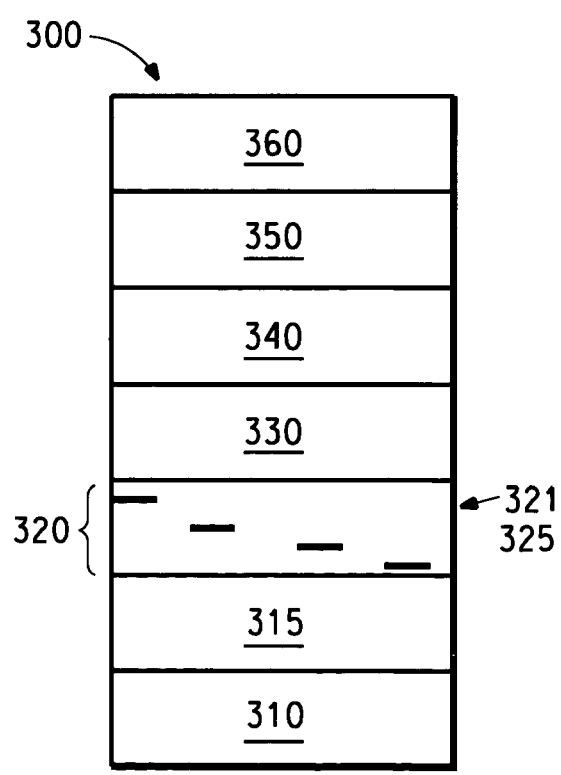

The device emits green light with an electroluminescent efficiency of 25 cd/A at 13 V, and a radiance of 10,000 cd/m2 at 19 V. Its radiance vs. voltage curve is shown in FIG. 5, as 5-c. Its efficiency vs. voltage curve is shown in FIG. 6, as 6-c.

Comparative Example 2

In this comparative example a device was made having a prior art structure, as shown in FIG. 1.

The device was made according to the General Procedure with the following configuration:
Substrate: glass
Anode: ITO
Hole transport layer: CBP (302 Å)
Emitter: G1 (405 Å)
Electron transport layer: DPA (103 Å)
Electron transport layer: AlQ(303 Å)
Cathode: LiF(10 Å)/Al(505 Å)

The device emits green light with an electroluminescent efficiency of 15 cd/A at 7 V, and a radiance of 25,000 cd/m$^2$ at 12 V. Its radiance vs. voltage curve is shown in FIG. 5, as 5-b. Its efficiency vs. voltage curve is shown in FIG. 6, as 6-b.

Compared to devices made with MPMP as the hole transport layer, the CBP based devices show higher radiance and lower threshold voltage for injection while the MPMP based devices show higher efficiency, as shown in FIGS. 5 and 6.

Comparative Example 3

Figure 2:
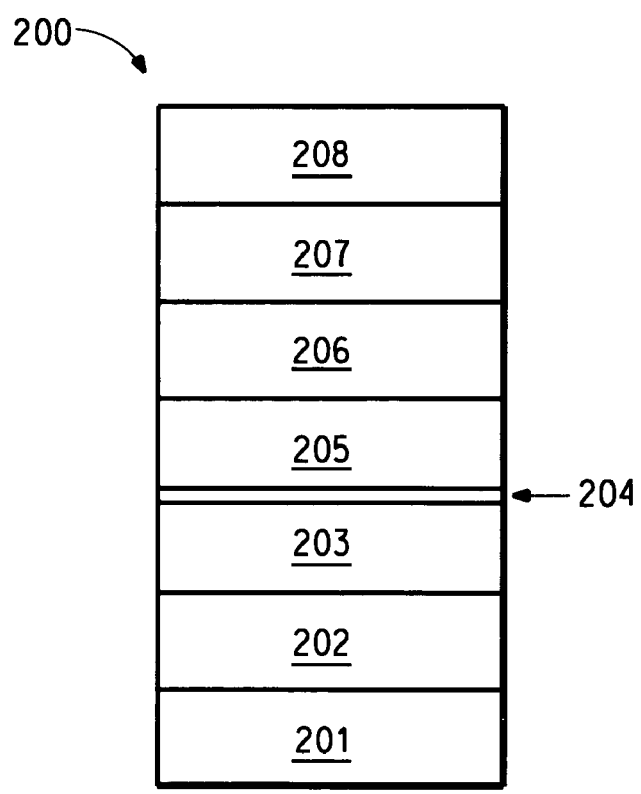
FIG. 2: A schematic diagram of another prior art OLED device.

In this comparative example a device was made having a prior art structure, which has been disclosed in US 2003/0075720 A1, and is shown in FIG. 2. Layer 201 is the transparent substrate, over which anode 202 is formed. Layer 203 is the hole transport layer; 205 the light emitter layer, 206 and 207 are two electron transport layers and 208 is the cathode. A thin interface layer 204 is inserted between the hole transport layer and the light emiter layer to enhance the device luminance efficiency. The thickness of the interface layer is in the range of 0.1 to 5 nm. Typical materials used as the interface layer are: anthracene, terphenyl, quaterphenyl, hexaphenylbenzene, phenyloxazole, and spirobifluorene.

The device was made according to the General Procedure with the following configuration:
Substrate: glass
Anode: ITO Hole transport layer: MPMP (303 Å)
Thin interface layer: anthracene (4 Å)

Emitter: G1 (402 Å)
Electron transport layer: DPA (103 Å)
Electron transport layer: AlQ(301 Å)
Cathode: LiF(10 Å)/Al(505 Å)

The device emits green light with an electroluminescent efficiency of 1.3 cd/A at 15 V, and a radiance of 800 cd/m$^2$ at 20 V. These numbers are more than one order of magnitude lower than devices made with MPMP alone as the hole transport layer as shown in Example 1. Clearly, the addition of a thin interface layer between the hole transport layer and the emitter layer did not improve the device properties.

Example 1

In this example a new device was made having the structure shown in FIG. 3.

A series of devices were made according to the General Procedure with the following device configuration:
Substrate: glass
Anode: ITO
New Charge Transport layer, a Spatially-doped hole transport layer:
CBP/MPMP/CBP Emitter layer: G1
Electron transport layer: DPA
Electron transport layer: AlQ
Cathode: LiF/Al The thickness of thin MPMP guest sublayer is a substantially continuous sublayer (and not islands of guest material) and varies in thinkness from 50 Å to 10 Å. The weight % of guest material in the hole transport layer was 13.31% wt; 5.35% wt; 4.60%; and 2.73%, for Example 1a,1b,1c, and 1d, respectively. The device configurations, peak efficiency, and peak radiance of devices are summarized in Table I, which illustrates that the new charge transport layer, in this example the spatially-doped MPMP sublayer in the host CBP hole transport material improved the device performance dramatically compared to devices using MPMP or CBP alone as the hole transport layer or using MPMP with an anthracene interlayer.

The radiance vs voltage and efficiency vs voltage curves of a device made with a 10 Å thick MPMP layer spatially doped in CBP is shown in FIG. 5 as 5-a, and FIG. 6 as 6-a, in comparison with devices made with either MPMP or CBP alone. Device made with 10 Å spatially doped MPMP layer shows both high efficiency and high radiance, combining the positive attributes of both MPMP and CBP.

TABLE I

Device configurations, peak efficiency, and peak radiance of devices made with spatially doped hole transport layer.

| Examples | Device configuration | Peak efficiency, cd/A | Peak radiance, cd/m2 |
|---|---|---|---|
| Example 1-a | CBP(204 Å) MPMP(53 Å) CBP(202 Å) G1(402 Å) DPA(101 Å) AlQ(301 Å) LiF(10 Å) Al(505 Å) | 21 cd/A at 9 V | 27,000 cd/m2 at 14 V |
| Example 1-b | CBP(207 Å) MPMP(22 Å) CBP(204 Å) G1(405 Å) DPA(101 Å) AlQ(303 Å) LiF(10 Å) Al(504 Å) | 24 cd/A at 14 V | 34,000 cd/m2 at 18 V |
| Example 1-c | CBP(204 Å) MPMP(15 Å) CBP(202 Å) G1(404 Å) DPA(102 Å) AlQ(303 Å) LiF(10 Å) Al(503 Å) | 22 cd/A at 7 V | 50,000 cd/m2 at 13 V |
| Example 1-d | CBP(201 Å) MPMP(11 Å) CBP(202 Å) G1(401 Å) DPA(102 Å) AlQ(301 Å) LiF(10 Å) Al(505 Å) | 24 cd/A at 7 V | 60,000 cd/m2 at 18 V |

What is claimed is:

1. A charge transport layer comprising a host charge transport material and a guest charge transport material, wherein said guest material is not homogeneously distributed in the host material and is spatially-doped within the host material.

2. A charge transport layer according to claim 1, wherein the host material is a hole transport material and the guest material is a hole transport material.

3. A charge transport layer according to claim 2, wherein the lowest unoccupied molecular orbital level of the guest hole transport material is higher than the lowest unoccupied molecular orbital level of the host hole transport material.

4. A charge transport layer according to claim 2, wherein the host material is different from the guest material, and each of the host material and guest material is selected from N,N'-diphenyl-N,N'-bis(3-methylphenyl)-[1,1'-biphenyl]4,4'-diamine (TPD), 1,1-bis[(di4-tolylamino) phenyl]cyclohexane (TAPC), N,N'-bis(4-methylphenyl)-N,N'-bis(4-ethylphenyl)-[1,1'-(3,3'-dimethyl)biphenyl]-4,4'-diamine (ETPD), tetrakis-(3-methylphenyl)-N,N,N', N'-2,5-phenylenediamine (PDA), a-phenyl-4-N,N-diphenylaminostyrene (TPS), p-(diethylamino)benzaldehyde diphenylhydrazone (DEH), triphenylamine (TPA), bis[4-(N,N-diethylamino)-2-methylphenyl](4-methylphenyl)methane (MPMP), 1-phenyl-3-[p-(diethylamino)styryl]-5-[p-(diethylamino)phenyl] pyrazoline (PPR or DEASP), 1,2-trans-bis (9H-carbazol-9-yl)cyclobutane (DCZB), N,N,N',N',-tetraskis(4-methylphenyl)-(1,1-biphenyl)-4,4'-diamine (TTB), 4,4'-bis[N-(1-naphthyl)-N-phenylamino]biphenyl (NPB or NPD), carbazole biphenyl (CBP), porphyrinic compounds, polyvinylcarbazole, (phenyimethyl)polysllane, polythiophenes, polypyrroles, polyanilines and mixtures thereof.

5. A charge transport layer according to claim 1, wherein the host material is an electron transport material and the guest material is an electron transport material.

6. A charge transport layer according to claim 5, wherein the highest occupied molecular orbital level of the guest electron transport material is lower than the highest occupied molecular orbital level of the host electron transport material.

7. A charge transport layer according to claim 5, wherein the host material is different from the guest material, and each of the host material and guest material is selected from metal chelated oxinoid compounds, azole compounds, quinoxaline derivatives, phenanthroline derivatives, and mixtures thereof.

8. A charge transport layer according to claim 1, wherein the host material is at least 60% by weight of the charge transport layer.

9. A charge transport layer according to claim 1, wherein the host material is at least 75% by weight of the charge transport layer.

10. A charge transport layer according to claim 1, wherein the charge transport layer has a first thickness and the guest material comprises a thin film having a second thickness within the host material, and the second thickness is less than 50% of the first thickness.

11. A charge transport layer according to claim 10, wherein the second thickness is from 1% to 20% of the first thickness.

12. The charge transport layer of claim 1, wherein the guest material is present in discrete locations within the host material.

13. The charge transport layer of claim 12, wherein the guest material is present as an ultrathin sublayer within the host material.

14. A charge transport layer comprising a host hole transport material and a guest hole transport material, wherein said guest material is spatially-doped within the host material, wherein the host material comprises a compound having at least two carbazole groups and the guest material comprises a triarylmethane compound.

15. A charge transport layer comprising a host hole transport material and a guest hole transport material, wherein said guest material is spatially-doped within the host material, wherein the host material comprises Formula I below:

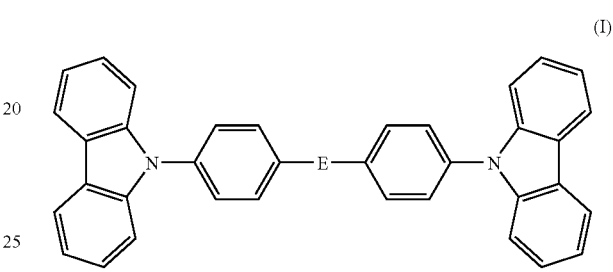

wherein E is selected from a single bond, $(CR^1R^2)m$, O, S, $(SiR^1R^2)m$ wherein m is an integer of 1 to 20, wherein $R^1$ and $R^2$ are each independently selected from H, F, alkyl, aryl, alkoxy, aryloxy, fluoroalkyl, fluoroaryl, fluoroalkoxy, and fluoroaryloxy, and wherein $R^1$ and $R^2$ can, when taken together, can form 5- or 6-membered rings; and wherein the guest hole transport material comprises Formula II below:

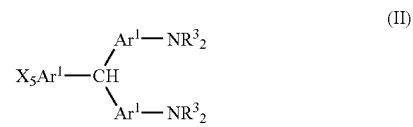

wherein:
$Ar^1$ can be the same or different at each occurrence and is selected from aryl and heteroaryl;
$R^3$ can be the same or different at each occurrence and is selected from H, alkyl, heteroalkyl, aryl, heteroaryl, arylalkylene, heteroarylalkylene, $C_nH_aF_b$, and $C_6H_cF_d$; or adjacent $R_3$ groups can be joined to form 5- or 6-membered rings;
X can be the same or different at each occurrence and is selected from $R_3$, alkenyl, alkynyl, $N(R^1)_2$, $OR^1$, $OC_nH_aF_b$, $OC_6H_aF_d$, halide, $NO_2$, OH, CN, and $COOR^1$;
n is an integer, and
a, b, c, and d are 0 or an integer such that $a+b=2n+1$, and $c+d=5$.

16. A charge transport layer comprising a host hole transport material and a guest hole transport material, wherein said guest material is spatially-doped within the host material, and wherein the host is CBP and the guest is MPMP.

* * * * *